(12) United States Patent
Chong et al.

(10) Patent No.: US 10,380,291 B2
(45) Date of Patent: Aug. 13, 2019

(54) SYSTEM AND METHOD FOR HIGH-SPEED SERIAL LINK DESIGN

(71) Applicant: Texas Instruments Incorporated, Dallas, TX (US)

(72) Inventors: Kian Haur Chong, McKinney, TX (US); Makram Monzer Mansour, San Jose, CA (US); Ashwin Vishnu Kamath, Bangalore (IN); Srikanth Pam, Bangalore (IN); Yudhister Satija, Panchkula (IN); Nithya Narayanaswamy, Plano, TX (US); Khang Duy Nguyen, Bellevue, WA (US); Pavani Jella, Campbell, CA (US); Jeff Perry, Cupertino, CA (US); Pradeep Kumar Chawda, Cupertino, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/050,582

(22) Filed: Feb. 23, 2016

(65) Prior Publication Data
US 2016/0253446 A1    Sep. 1, 2016

Related U.S. Application Data

(60) Provisional application No. 62/121,169, filed on Feb. 26, 2015.

(51) Int. Cl.
*G06F 17/50* (2006.01)

(52) U.S. Cl.
CPC ...... *G06F 17/5036* (2013.01); *G06F 17/5063* (2013.01)

(58) Field of Classification Search
CPC ... G06F 17/50; G06F 17/5036; G06F 17/5063
(Continued)

(56) References Cited

U.S. PATENT DOCUMENTS

| 6,530,065 B1 * | 3/2003 | McDonald | G06F 17/5036 716/102 |
| 6,606,588 B1 * | 8/2003 | Schaumont | G06F 17/5022 703/15 |

(Continued)

*Primary Examiner* — Stacy Whitmore
(74) *Attorney, Agent, or Firm* — Ebby Abraham; Charles A. Brill; Frank D. Cimino

(57) ABSTRACT

A system and method for web-based interface design tool is provided. The design tool enables system designers to quickly and independently design a custom serial-link interface. The system provides interface selection and signal integrity analysis. An interface selection may interact with system designers to prompt for a set of selection criteria such as data-rate, supply rail, standard protocol, and intended application. An intelligent search engine screens through a large interface products database based on the selection criteria and provides designers with a list of devices that potentially meet the design criteria. The performance of the custom system with the selected device can be evaluated by using a web-based IBIS-AMI standard-compliant signal integrity simulator. A designers can have options to manually fine tune selected devices' parameters to iterate through different settings to determine the robustness of the solution.

16 Claims, 24 Drawing Sheets

(58) Field of Classification Search
USPC .......................................................... 716/136
See application file for complete search history.

(56) References Cited

U.S. PATENT DOCUMENTS

| | | | | |
|---|---|---|---|---|
| 7,308,670 | B2* | 12/2007 | Felton | G06F 17/5077 |
| | | | | 716/137 |
| 7,548,842 | B2* | 6/2009 | Ganesan | G06F 17/5022 |
| | | | | 370/258 |
| 7,627,463 | B2* | 12/2009 | Chidhambarakrishnan | |
| | | | | G06F 17/5022 |
| | | | | 703/14 |
| 7,693,691 | B1* | 4/2010 | Tao | G06F 17/5009 |
| | | | | 375/267 |
| 7,720,666 | B1* | 5/2010 | Niver | H04L 43/0823 |
| | | | | 703/17 |
| 8,283,993 | B2* | 10/2012 | Coleman | H01R 35/02 |
| | | | | 174/110 R |
| 8,611,406 | B2* | 12/2013 | Dai | G01R 31/3171 |
| | | | | 375/224 |
| 8,626,474 | B2* | 1/2014 | Li | G06F 17/5009 |
| | | | | 703/13 |
| 9,178,542 | B1* | 11/2015 | Shimanouchi | H04B 1/0475 |
| 9,405,865 | B2* | 8/2016 | Li | G06F 17/5009 |
| 9,638,750 | B2* | 5/2017 | Becker | G01R 31/31703 |
| 2003/0216901 | A1* | 11/2003 | Schaumont | G06F 17/5045 |
| | | | | 703/13 |
| 2004/0268283 | A1* | 12/2004 | Perry | G06F 17/5045 |
| | | | | 716/119 |
| 2006/0013328 | A1* | 1/2006 | Zhang | H04B 1/7105 |
| | | | | 375/267 |
| 2006/0136857 | A1* | 6/2006 | Felton | G06F 17/5077 |
| | | | | 716/137 |
| 2006/0217949 | A1* | 9/2006 | Chidhambarakrishnan | |
| | | | | G06F 17/5022 |
| | | | | 703/14 |
| 2010/0235206 | A1* | 9/2010 | Miller | E04D 3/352 |
| | | | | 705/7.11 |
| 2010/0325599 | A1* | 12/2010 | Perry | G06F 17/50 |
| | | | | 716/122 |
| 2013/0332138 | A1* | 12/2013 | Koga | G06F 17/5036 |
| | | | | 703/14 |
| 2016/0253446 | A1* | 9/2016 | Chong | G06F 17/5036 |
| 2016/0378885 | A1* | 12/2016 | Jones | G06N 5/00 |
| | | | | 703/6 |

* cited by examiner

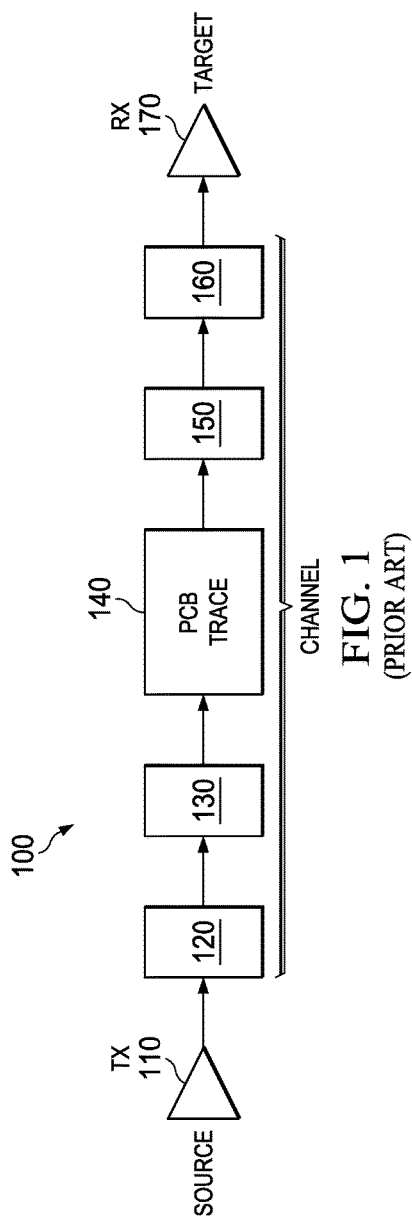
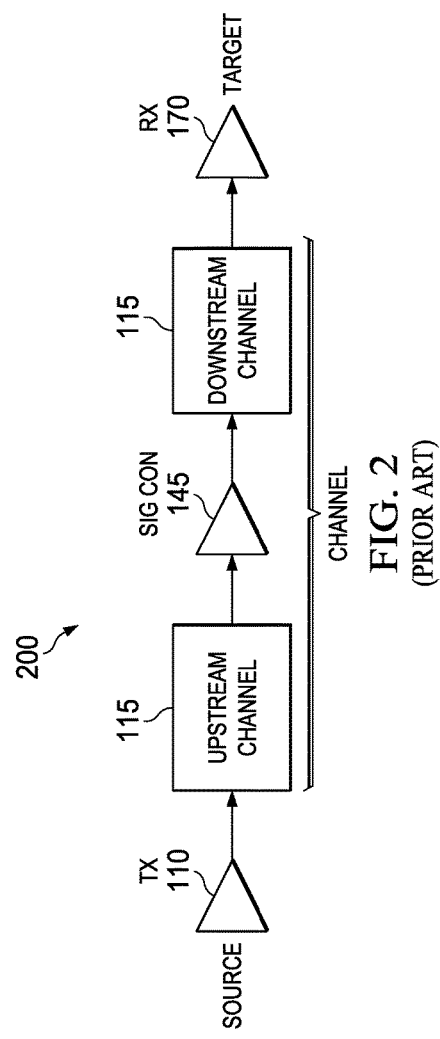
FIG. 1 (PRIOR ART)
FIG. 2 (PRIOR ART)

FIG. 6E

SELECTING TX AND RX DEVICES

| Power | FPGA/μP | LED | Clocks |
| Filters | Sensors | Interface | Reference |

TX → CHANNEL → RX

Tx: TI Tx
Mid Channel: No Mid Channel SigCon
Rx: TI Rx
Max Data Rate: 10 Gbps
Device Mode: Differential
Start Design

FIG. 7B

SELECTING SIGNAL CONDITIONING DEVICES

| Power | FPGA/μP | LED | Clocks |
| Filters | Sensors | Interface | Reference |

TX → CHANNEL → SigCon → CHANNEL → RX

Tx: Generic Tx
Mid Channel: TI Mid Channel SigCon
Rx: Generic Rx
Max Data Rate: 10 Gbps
Device Mode: Differential
Start Design

FIG. 7C

| FIG. 7D-1 | FIG. 7D-2 | FIG. 7D |

| FIG. 7E-1 | FIG. 7E-2 | FIG. 7E |

SELECTING A TRANSMITTER

FIG. 7D-1

INTERFACE DESIGNER VISUALIZER

TO FIG. 7D-2

WEBENCH Optimizer

Lowest BOM Cost — Smallest Footprint — EQ Score

Footprint (mm²) 16 | BOM Cost (XX) 5.5 | EQ Score 0.75

Basic Input Selections

TX (Not Selected) → CHANNEL → RX (Not Selected)

Rating: All
Max Data Rate: 10 Gbps
VSupply = All V
Protocol: All
Device Functions: Transmitter

[Recalculate]

Search [ ]  Solutions 122 found!

| Part Name | Select Part | # of Channel(s) | Models | Application Category | Device Function | Protocol |
|---|---|---|---|---|---|---|
| 081BIR111 | Select | 1 | IBS_AM | Server & Storage/Telecom & Datacom/Wireless Infrastructure | Repeater Transmitter/ Receiver | 10GEI 116-MR FDISA91/SA92 InfiniBand DPRI RX4UI |
| 08100B210 | Select | 1 | IBS_AM | Server & Storage/Telecom & Datacom/Wireless Infrastructure | Repeater Transmitter/ Receiver | 10GEI 116-MR FDISA91/SA92 InfiniBand DPRI RX4UI |

Advanced Charting

X Axis: Score ▼   Y Axis: Footprint ▼   Bubble Size: Low Cost ▼

SELECTING A RECEIVER

TO FIG. 7E-2

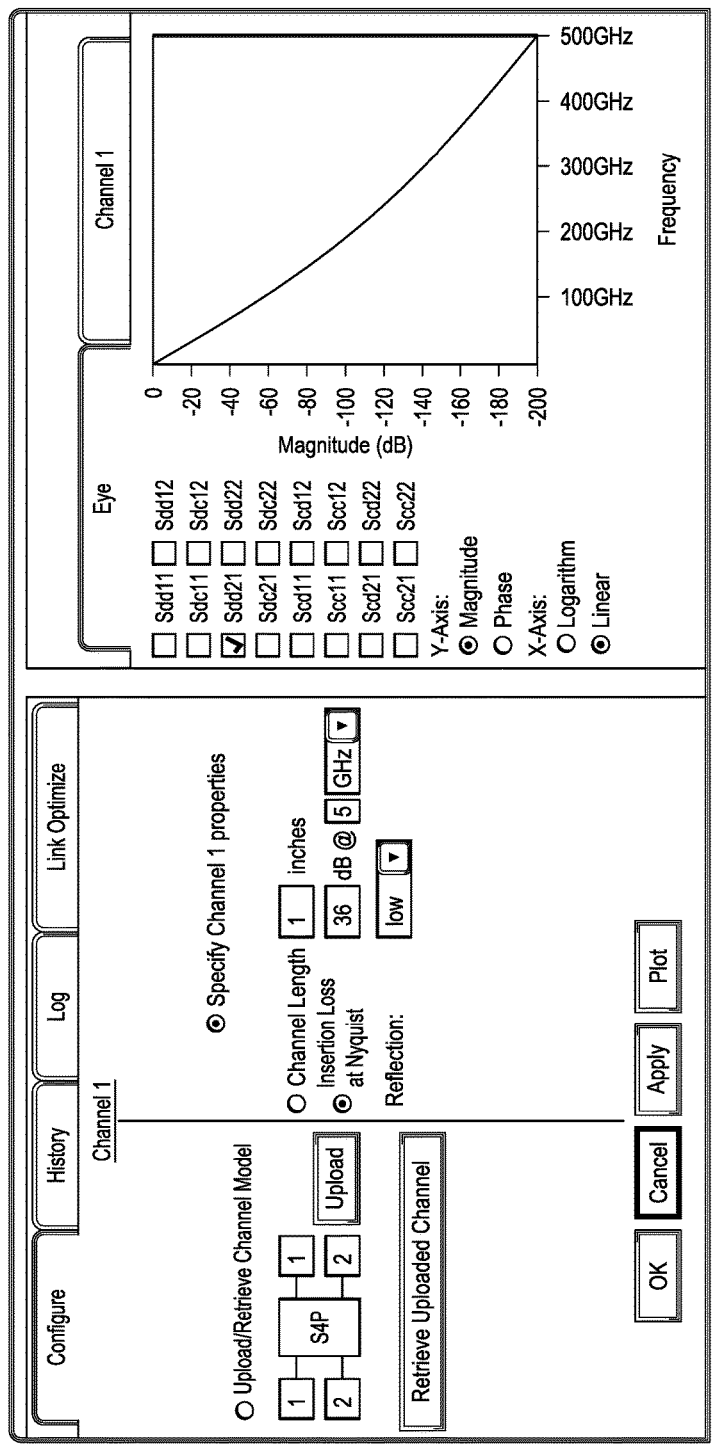
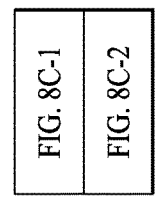
FIG. 8B
FIG. 8C

SYSTEM AND METHOD FOR HIGH-SPEED SERIAL LINK DESIGN

CROSS-REFERENCE TO RELATED APPLICATIONS

This application claims priority to the U.S. provisional patent application Ser. No. 62/121,169, filed Feb. 26, 2015 the entirety of which is hereby incorporated herein by reference for all purposes.

TECHNICAL FIELD

This disclosure relates generally to the field of circuit design and more particularly to high-speed serial link design systems.

BACKGROUND

The increasing demand in exchanging data faster in datacenters, enterprise server/storage, and wireless infrastructure applications has led the proliferation of high-speed interface protocols and devices such as transmitters, receivers, and mid channel signal conditioner that are compliant to industrial standard such as IEEE 802.3a/g, USB3, HDMI and others. As data-rate increase into multi-Giga bit realm, channel loss, reflection, jitter, and cross-talk cause a dominant effect on the system performance. It is crucial for a high-speed serial link system designer to identify the right devices to meet the system performance requirements and at the same time reduce power, footprint size, and total bill of material (BOM) cost.

Referring to FIG. 1, a conventional signal flow diagram 100 for a typical high-speed serial link transmitter-receiver pair is illustrated. The typical signal flow 100 for high-speed serial link system includes a transmitter 110 as a signal source, a channel that comprised of transmitter package 120, transmitter site connector 130, PCB trace 140, receiver site connector 150, receiver package 160, and a receiver 170 to recover the signal.

Referring to FIG. 2, a conventional signal flow diagram 200 for a typical high-speed serial link transmitter-receiver pair with signal strength boosting components is illustrated. Signal flow diagram 200 includes transmitter 110, upstream channel 115, which includes components such as transmitter package 120 and transmitter site connector 130. A downstream channel 155 including a receiver site connector 150 and a receiver package 160, and a receiver 170. A signal conditioner (SigCon) component 145 is added in the path to boost signal strength to improve signal condition due to unavoidably high insertion loss.

High-speed serial link devices such as transmitters, receivers, and mid-channel signal conditioners illustrated in FIGS. 1-2 are proliferating in the industry due to increasing demand for bandwidth. A myriad of integrated circuits (ICs) are available in the market for high-speed interface and this creates a significant challenge for high-speed serial link system designers to identify the optimal IC that can meet the system performance requirements and at the same time reduce power, footprint size, and total BOM cost. A typical interface part selection process starts by screening through hundreds of datasheets from IC manufacturers' websites to identify potential solutions. This is followed by contacting the IC vendor for an evaluation to help identify the optimal device(s). Typically, in transmitter selection process, the bandwidth, jitter performance, and equalization characteristics are the main consideration. For receiver selection, there are multiple facets of equalization needs to be considered such as Continuous Time Linear Equalization (CTLE) and Decision Feedback Equalization (DFE).

It is a daunting task to design a high-speed serial link system as it involves cross-disciplinary technical knowledge such as microwave transmission theory, analog and digital compensation theory, and signal integrity theory. For mid-channel devices, various functions such as re-drivers, re-timers, or mux/fanouts can be carefully considered to select the most appropriate device. In addition to the selection process, system engineers need to be able to quickly validate through simulations that the identified serial-link device(s) meets their system performance requirements. This process can take weeks to complete, making it difficult to effectively compare multiple solutions in a timely manner.

SUMMARY

In accordance with an embodiment, an apparatus is disclosed. The apparatus includes a user interface, and a processing unit. The processing unit is configured to receive a representative model an electronic circuit from the user interface, select at least one electronic component matching at least one parameter of the electronic circuit, and perform signal integrity analysis for the electronic circuit using one or more characteristics of the selected electronic component.

In accordance with another embodiment, a method is disclosed. The method includes receiving a representative model an electronic circuit from the user interface, selecting at least one electronic component matching at least one parameter of the electronic circuit, and performing signal integrity analysis for the electronic circuit using one or more characteristics of the selected electronic component.

BRIEF DESCRIPTION OF THE DRAWINGS

FIG. 1 illustrates a conventional signal flow diagram for a typical high-speed serial link transmitter and receiver pair.

FIG. 2 illustrates a conventional signal flow diagram for a typical high-speed serial link transmitter and receiver pair with signal strength boosting components.

FIGS. 6A-I illustrate exemplary displays of the design methodology tool during the process of selecting and simulating a device according to an embodiment.

FIGS. 7A-E illustrate an exemplary system architecture for a design methodology and link optimization tool and its various functions according to an embodiment.

FIGS. 8A-E illustrate signal integrity analysis function of the design methodology tool according to an embodiment

DETAILED DESCRIPTION

The following description provides many different embodiments, or examples, for implementing different features of the subject matter. These descriptions are merely for illustrative purposes and do not limit the scope of this disclosure.

According to example embodiments, a system and method for web-based interface design tool is provided. The design tool enables system designers to quickly and independently design a custom serial-link interface. The system provides interface selection and signal integrity analysis. An interface selection may interact with system designers to prompt for a set of selection criteria such as data-rate, supply rail, standard protocol, intended application, and the like. An intelligent search engine screens through a large interface products database based on the selection criteria and provides designers with a list of ICs that potentially meet the criteria. Further, a signal integrity analysis panel automatically loads the selected devices' Input/output Buffer Information Specification-Algorithmic Modeling Interface (IBIS-AMI) models into a serial-link schematic template. A designer can also setup system backplane characteristics by using a channel estimation tool. The performance of the custom system with the selected device can be evaluated by using a web-based IBIS-AMI standard-compliant signal integrity simulator. In addition, designers can have options to manually fine tune selected devices' parameters to iterate through different settings to determine the robustness of the solution.

The system can be implemented on a standalone processing unit, a distributed computing network, internet based web application, or among various other network applications. All interface design computations can be done in background and user can provide inputs regarding system application requirements. Users can also compare different interface designs and choose the optimal solution for their application. This approach provides a solution in significantly shorter time (e.g., in minutes) versus conventional design tools that may take weeks to finalize a given serial link design.

Figure 3A:
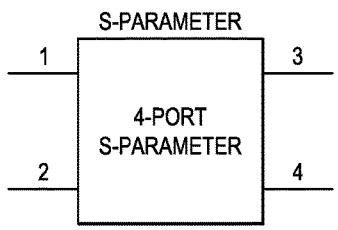
FIGS. 3A-B ("FIG. 3") illustrate an exemplary high-speed serial link channel model using 4-port s-parameter and its insertion loss according to an embodiment.
Figure 3B:
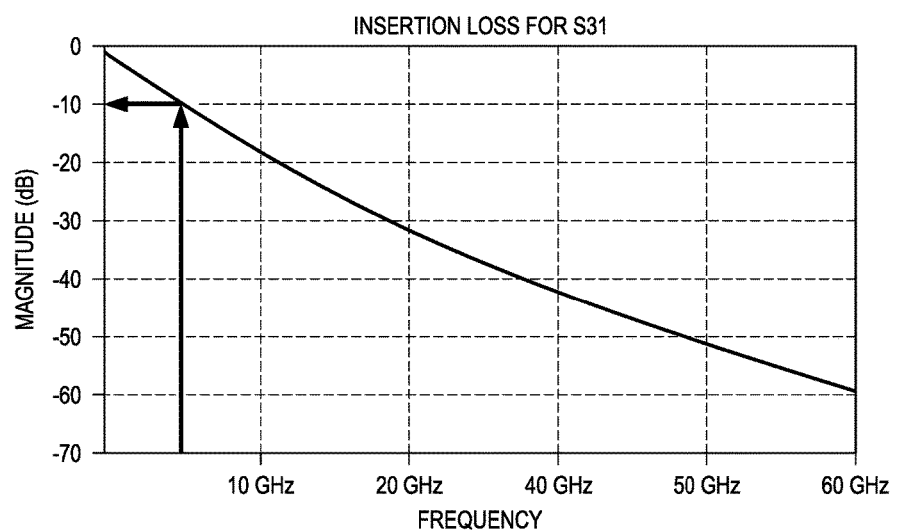

Referring to FIGS. 3A-B, an exemplary high-speed serial link channel model using 4-port s-parameter and its insertion loss is illustrated according to an example embodiment. The 4-port s-parameter model illustrated in FIG. 3A is used to capture insertion loss, signal reflection, and cross-couple characteristics of the high-speed serial link channel. As illustrated in FIG. 3B, the insertion loss S31 captures the through channel loss across a specific frequency range by taking the ratio of the leaving voltage at port 3 and the incident voltage of port 1. The insertion loss and S42 captures through channel loss across a specific frequency range by taking the ratio of the leaving voltage and the ratio of the leaving voltage at port 4 and the incident voltage at port 2 as illustrated in FIG. 3A. The reflections, S11, S22, S33, and S44 capture the amount of signal that is reflected back to each individual port. The cross-couple signals S12, S14, S21, S23, S32, S34, S41 and S43 capture the amount of signal that is coupled to a port from another port. To determine the loss of a channel the amount loss along the curve of a frequency that is one-half of the system data-rate (based on Nyquist sampling theorem) is identified. For example, if a given system is running at 10 Gbps then calculated sampling frequency is 10 GHz/2=5 GHz. The loss of the system running at 10 Gbps would be 10 dB, as illustrated in FIG. 3B where frequency is shown on x-axis and the magnitude of loss in (dB) is shown on the y-axis.

Figure 4:
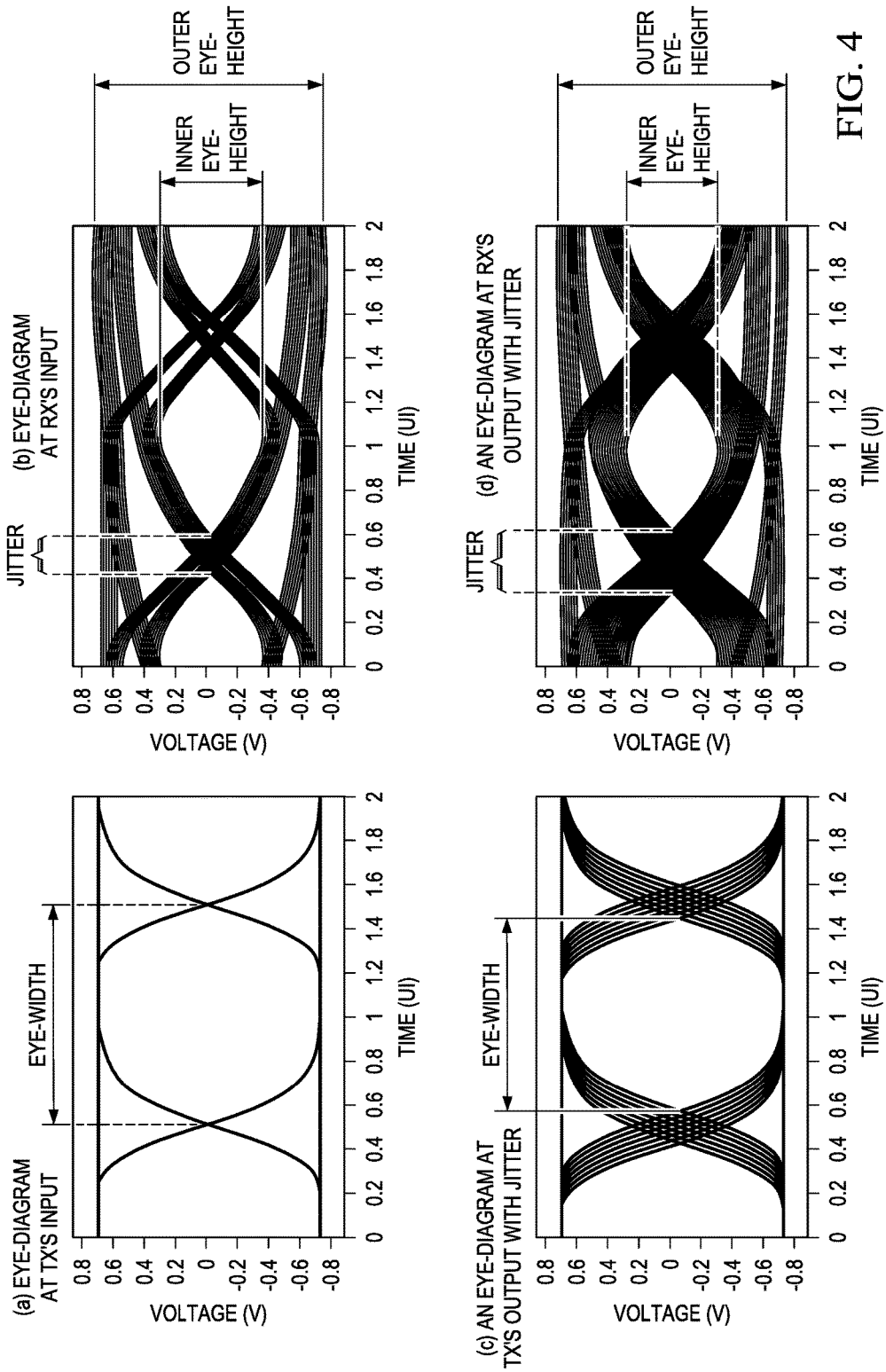
FIG. 4 illustrates an exemplary eye diagram for gauging signal integrity of a high-speed serial link system according to an embodiment.

Referring to FIG. 4, an exemplary eye-diagram for gauging signal integrity of a high-speed serial link system is illustrated according to an embodiment. The exemplary eye diagram can be generated using any high-speed serial link system such as for example the one illustrated in FIG. 1. In FIG. 4, (a) illustrates the eye-diagram that can be observed at the output of the transmitter 110 in FIG. 1. The eye-diagram illustrates that there is no jitter transferred or jitter generation from this transmitter as its eye-width spans the entire unit interval (UI) and its outer and inner eye-heights are about 1.4V. The exemplary transmitter 110 illustrates excellent signal integrity as it has ample eye-width and eye-height margins from the center of the eye.

Figure 8A:
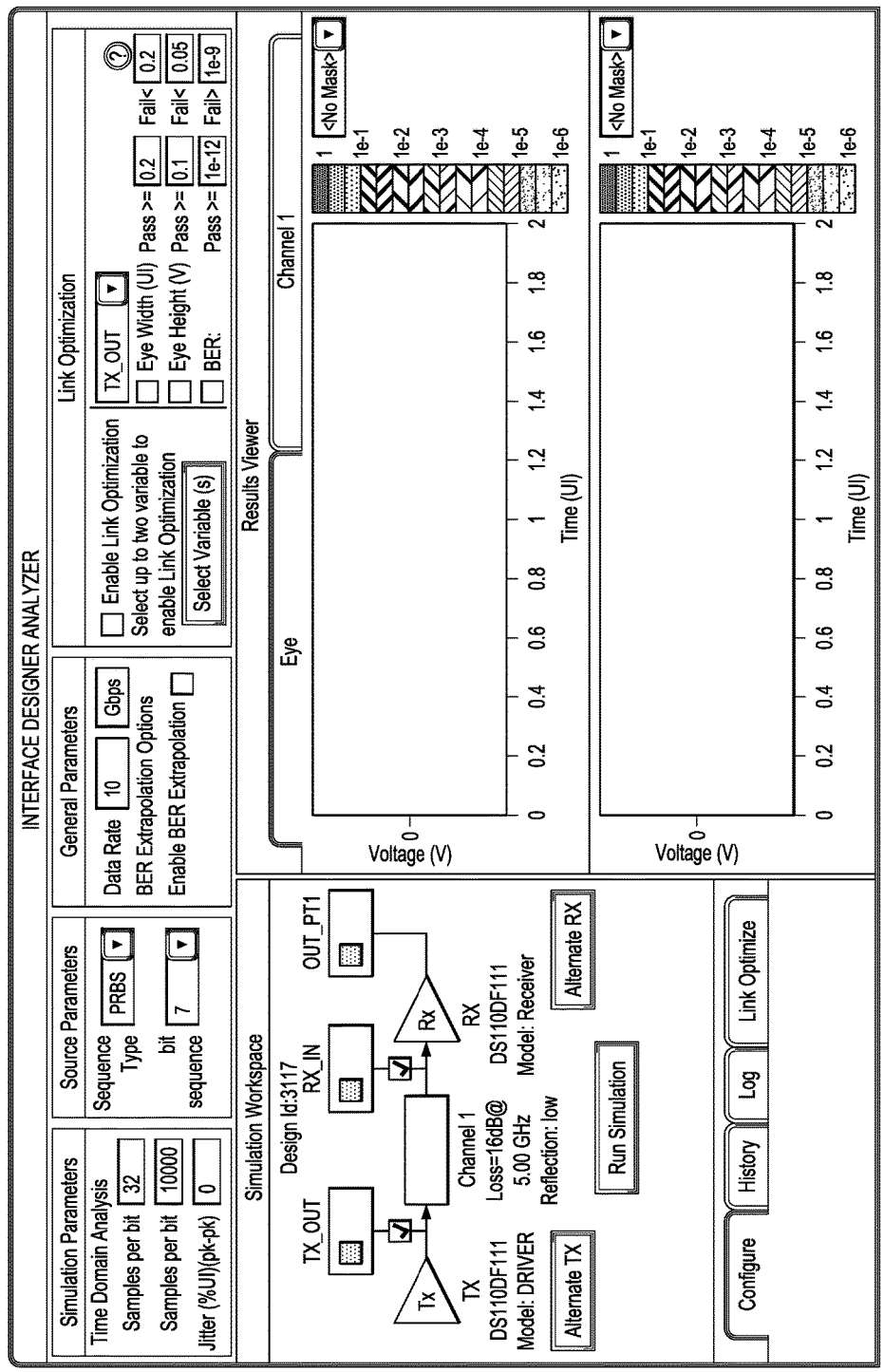
Figures 1, 8C:
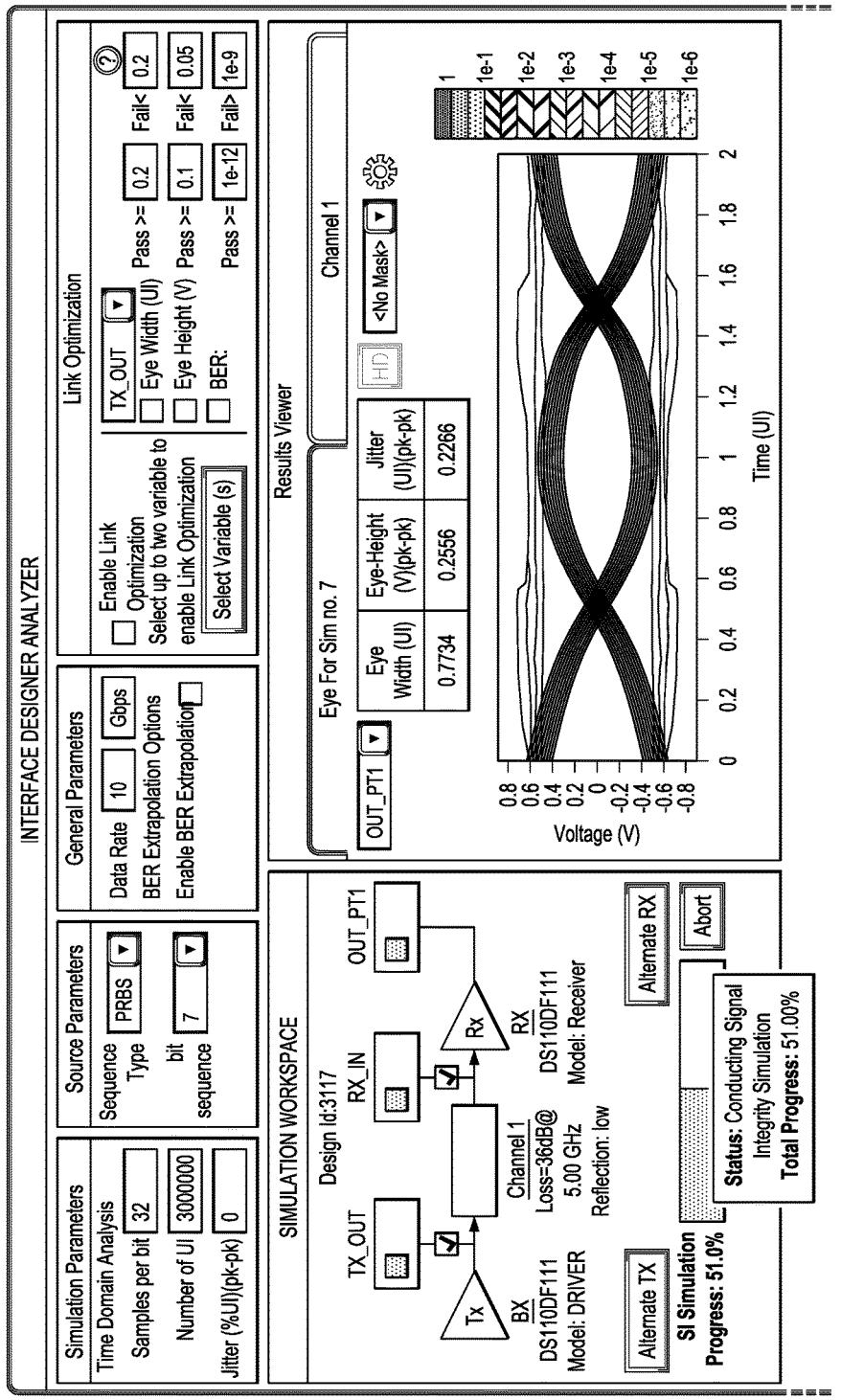
Figures 2, 8C:
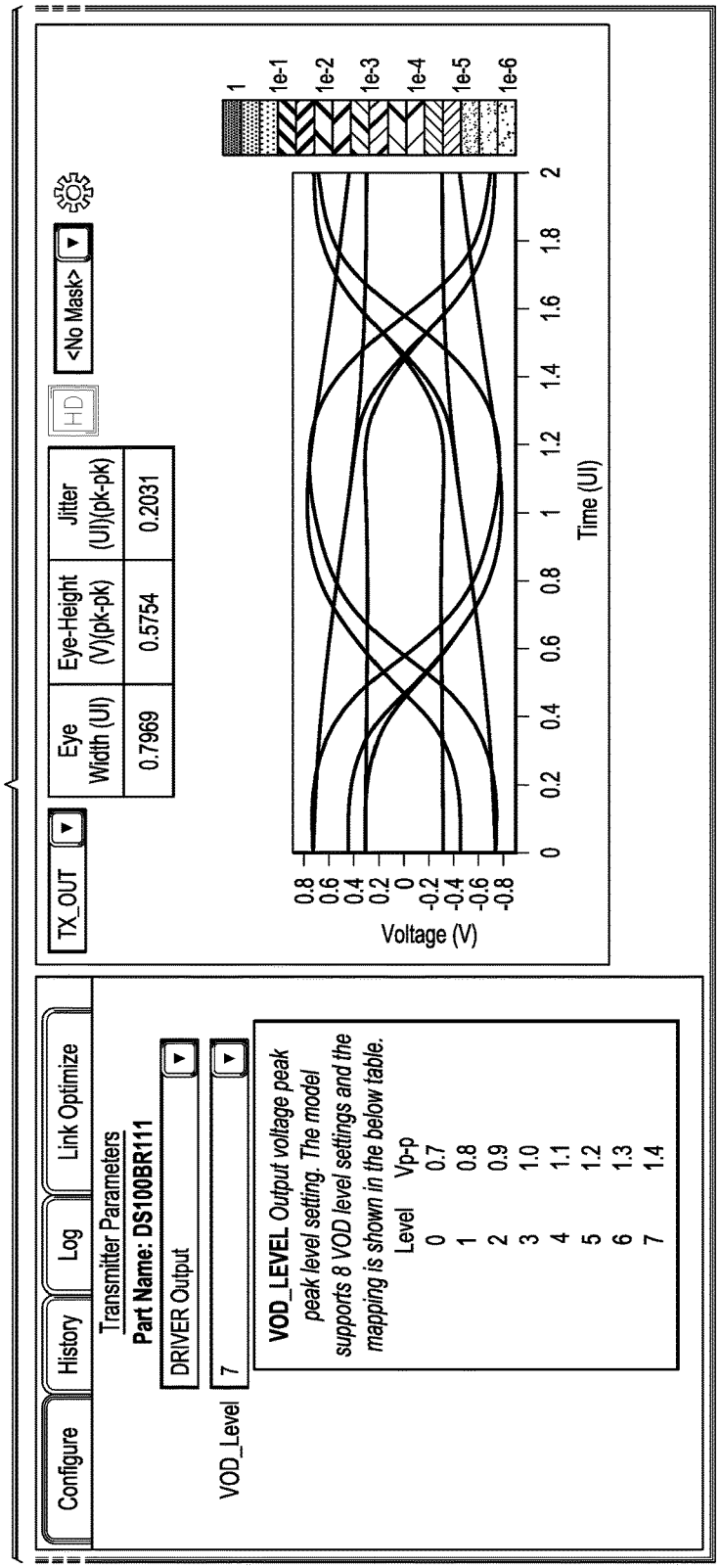

FIG. 4 (b) illustrates the eye-diagram observed at the input of a receiver such as for example receiver 170 in FIG. 1. As the signal travels from a transmitter (e.g. 110) to the input of the receiver, it could be attenuated by the loss of the channel, reflected by discontinuities along the signal path and distorted by cross-talk and/or power supply noise. The signal attenuation can cause the "eye" to 'close' vertically and horizontally. Typically, a channel exhibits more loss at higher frequency and the high-frequency data in a data-pattern can be attenuated more than the low-frequency data in a data-pattern. This causes the inner eye, which is composed mainly by high-frequency data, to be attenuated more than the outer eye that composed mainly by low-frequency data as illustrated in FIG. 4 (b). In addition, the eye-width can also be reduced by the Inter-symbol Interference (ISI) that causes the deterministic jitter.

FIGS. 4 (c) and (d) illustrate the eye-diagram that can be observed at the output of transmitter 110 and input of receiver 170, which are the same nodes as FIGS. 4 (a) and (b) respectively. The difference here is that 0.2 UI peak-to-peak random jitter has been injected into the transmitter 110. The effect of the jitter at the input of the receiver 170 not only narrows the eye-width but also reduces the eye-height. Therefore, proper knowledge of channel characteristic and reference clock jitter is needed to start a high-speed serial link system design.

According to an embodiment, an interface design methodology system and method is provided. The design methodology can be web-based, stand-alone system based, network based, distributed system based, or the like. The design methodology system enables system designers to quickly and independently design a custom serial-link interface. According to another embodiment, the system design methodology can be separated into two phases. The first phase of the system and method can include device selection and the second phase can include signal integrity analysis. In the device selection phase, a designer can input a set of selection criteria such as data-rate, supply rail, standard protocol, and intended application.

An intelligent search engine may then screen through a large interface products database based on the selection criteria and provide designers with a list of devices that potentially meet the selection criteria. In the signal integrity analysis phase, a signal integrity analyzer panel may load the selected devices' IBIS-AMI models into a serial-link schematic template. The IBIS AMI (Algorithmic Modeling Interface) are standards that define an interface between AMI models and various electronic design automation tools. IBIS AMI models are typically used to simulate a high-speed serial link's performance using an eye-diagram such as the one illustrated in FIG. 4 and bit-error-rate of the serial link.

This technique allows time-domain simulation of nonlinear time-invariant transmitter-receiver models, such as the one illustrated in FIG. 1, can be performed much faster and statistical simulation techniques can be utilized to predict low bit error rate (BER). According to an embodiment, designers can setup system backplane characteristics by using the built-in channel estimation tool of the interface design methodology system. The performance of the custom system with the selected device can be evaluated by using an IBIS-AMI standard-compliant signal integrity simulator.

While for explanation and simplification purposes, individual phases are described; however, the interface design system can have integrated design selection and signal integrity analysis. For example, based on given characteristics and parameters, the interface design methodology system can provide a device with its signal integrity analysis together such that the designer can have multiple options to add/remove devices based on the signal integrity analysis without analyzing the entire design.

Figure 5:
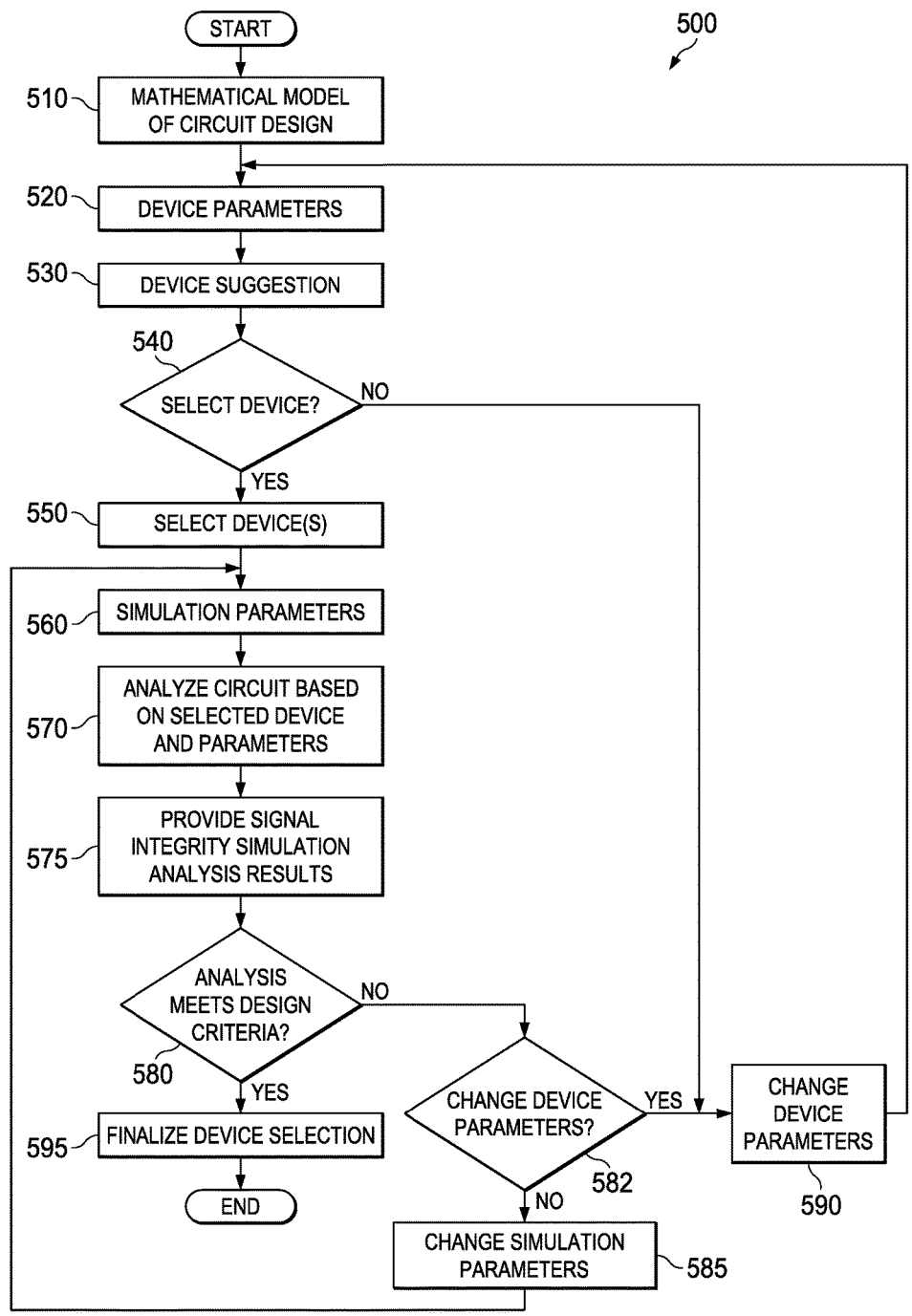
FIG. 5 illustrates an exemplary process flow diagram for selecting devices for a circuit design using an interface design methodology tool according to an embodiment.

Referring to FIG. 5, an exemplary process flow diagram 500 for selecting devices for a circuit design using an interface design methodology tool is illustrated according to an embodiment. At 510, a mathematical model of the circuit design (e.g., s-parameter model) is received by the design methodology tool. Channel characteristics of a circuit design system can be determined using a mathematical model such as for example, a simulated or measured 4-port scattering parameter or s-parameter model. The s-parameters model describes electrical behavior of a given design system when various steady state stimuli by electrical signals are applied to the system. For exemplary purposes, an s-parameter model is described; however, any mathematical representation of a circuit design can be used to implement the teachings of various embodiments described herein for example, other similar parameters such as Y-parameters, Z-parameters, H-parameters, T-parameters, DC or low frequency extraction of the circuit or the like. The characteristics of the circuit system can also be estimated using the channel length or loss. For example, if a given system operates at 10 Gbps and its signal path consists of a pair of differential printed circuit board (PCB) traces that have 35 dB loss at 5 GHz and two connectors that have 1 dB loss at 5 GHz, then the total channel loss can be estimated as 36 dB.

At 520, a designer can provide parameters for a device (e.g., transmitter, receiver, or combination thereof). These parameters can include data rate, device mode (differential, linear, or the like), type (TX/RX), mid channel components (additional signal conditioners etc.), or the like other parameters. Based on the device parameters, the design methodology tool searches a database of devices (TX/RX) and provides a list of devices that match the design parameters (e.g., device suggestions) at 530. The database of devices can be stored internally in the design tool or the design tool can access a device database over a network. Further, the device suggestions can be customized based on manufacturer/suppliers of devices.

The design methodology tool may graphically represent the selection of devices illustrating the configuration of devices using the transmitter and receiver or transmitters and receiver with additional signal conditioners selected by the designer. The tool may score or rank suggested devices based in their size, cost, and equalization strength and can display in an order chosen by the designer. The device suggestions may also include the cost of the device including bill of materials, which the designer can use to determine cost effective design components for the design while meeting the design criteria.

Based on the device suggestions, at 540, the designer may decide whether to select a particular suggested device or to change the parameters and fine tune the selection. If the designer decides to fine tune the device selection, then the designer can change device parameters at 590 and restart the device selection process at 520. If the designer selects a suggested device at 550, then the designer can provide simulation parameters at 560 for the tool to conduct the signal integrity analysis of the selected device design based on the parameters. When the simulation parameters are entered in the design methodology tool, then the tool performs signal integrity analysis at 570. After conducting the signal integrity simulation analysis on the selected device and the circuit model, the design methodology tool provides results of the analysis to the designer at 575 for example, an eye-diagram of the signal flow. The signal integrity analysis simulation may be presented to the designer on a graphical display based on the display settings adjusted by the designer. The signal integrity analysis may be made interactive for designer for example, the designer can update channel characteristic of the design to determine its effect on the signal integrity. The simulation results for various channel characteristics may be stored and logged in a storage as a history file that the designer can look to compare various changes in the characteristics and its impact on the signal integrity to pick a device that matches the design intent.

The channel characteristics of the design can be defined using the s-parameter model as described hereinabove or they can also be defined using the channel loss or physical length. The design methodology tool may provide/display a channel plot based on the channel insertion loss and the designer can examine the signal reflection through this plot at 580 and determine whether adjustments need to be made in the parameters at 580. The designer can either change the device parameters to select a completely new device at this stage at 590 or can adjust the signal reflection to be low, medium, or high to match intended channel reflection characteristic of the design by adjusting the simulation parameters at 585. The design methodology tool may be programmed to provide default settings that can maximize the signal integrity analysis for example, it can include transmitter and receiver terminations in the simulation thus simplifying the setup of the schematic.

Further, the tool may have default settings for transmitter to have the highest amplitude and highest de-emphasis settings, and turn on all auto-adaptation algorithms in the receiver for continuous time linear equalizer (CTLE) and Decision Feedback Equalizer (DFE). These settings may be tuned by the designer using various user interface such as for example by clicking on the image of the transmitter or receiver on the display. The tool may also provide the current status of the progress of signal integrity analysis. The signal integrity analysis can be displayed using various analysis representations such as for example an eye-diagram illustrated in FIG. 4 or the like. These eye-diagrams can be incrementally updated at the end of each block and so the designer can observe the signal integrity as the analysis progresses.

The design methodology tool may provide link optimization options to the designer to identify the optimal settings for a selected device. The designer can select multiple parameters of the selected device to optimize your system performance by adjusting the parameters and monitoring its impact on the performance displayed graphically. For devices that have auto-adaptation algorithms for CTLE and DFE (e.g., receivers), their settings can further be optimized by using standard AMI models. In such case, only the transmitter amplitude and de-emphasis settings need to be optimized for signal integrity analysis. The range and step size for the transmitter amplitude (VOD_Level), and transmitter de-emphasis (DE_Limit) can be adjusted in the tool so that the total iteration can be defined by the designer and limited as desired.

The design methodology tool may provide multiple levels of settings for the VOD_Level and DE_Limit for transmitter based on the number of iterations desired. For example, if four VOD_Levels and four DE_Limit are selected, then the total number of iterations with be 4×4=16. Similarly, if eight levels are selected for each setting then the total number of iterations will be 8×8=64. The tool may also provide options for optimizing settings from all iterations for example, a designer can perform a coarse optimization of the channel and then define a fine optimization level. For the coarse optimization, the step size can be set low (e.g. 2) for both VOD_Level and DE_Limit to reduce the total iteration to 4. Then the signal integrity at the receiver maybe optimized by selecting appropriate node of the circuit from various options provide by the tool. Various nodes can be selected for optimization based on the circuit design. After selecting a node for analysis, the eye diagram can be adjusted by selecting a metric from eye-width, eye-height, and BER to gauge the signal integrity at the selected node.

The circuit analysis iterates through all the specified settings and gauges the performance of each setting based on the selected metric or matrices. The link optimization process can examine the performance at the end of each blocks and advance the simulation to the next setting to cover the entire user specified search space. After completing the last iteration, the optimal setting is identified to the user using various presentation methods (text, graph, image, etc.). Once the user receives the link optimization analysis, at 580 the user may determine whether the analysis meets the design criteria. If the analysis does not meet the user design criteria then the user can determine whether to change the device parameters at 582. If the design parameters need changing, then the user may change the device parameters at 590 and run the analysis using updated parameters. If the link optimization analysis meets the design criteria for the user, then at 595 the user can finalize the design using suggested devices based on the link optimization analysis.

Figure 6A:
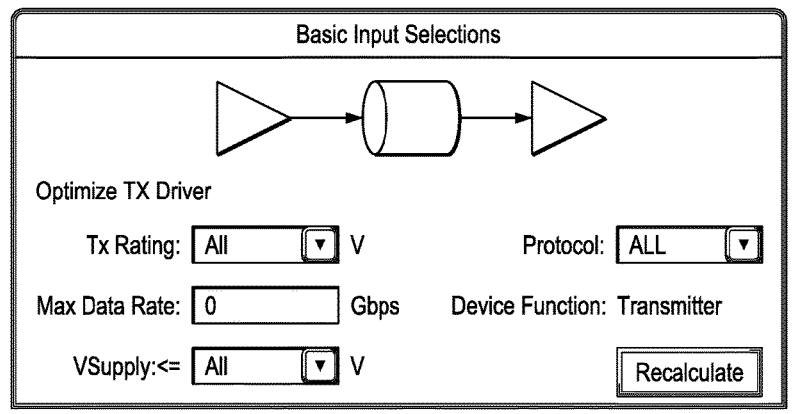

Referring to FIGS. 6A-I, exemplary displays of the design methodology tool during the process of selecting and simulating a device are illustrated according to an embodiment. These exemplary displays can be presented for example while following the exemplary process flow illustrated in FIG. 5. The design methodology tool may provide various predetermined design templates or a designer can upload his own design model. The predetermined templates may provide an option to select design optimization based on different stages of the design for example, transmitter (TX), mid-channel signal conditioner (SC), and/or receiver (RX). FIG. 6A illustrates an exemplary design template that a designer can use to conduct analysis.

Figure 6B:
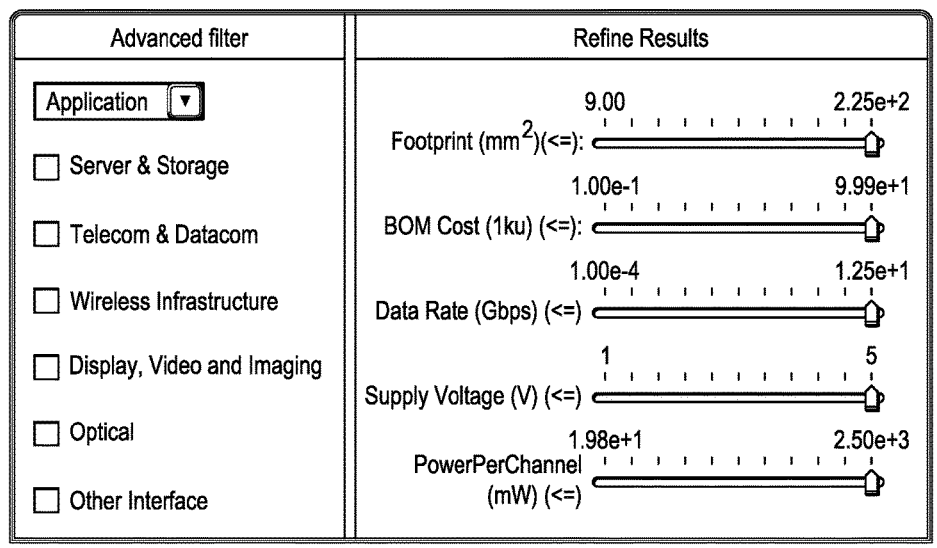
Figure 6C:
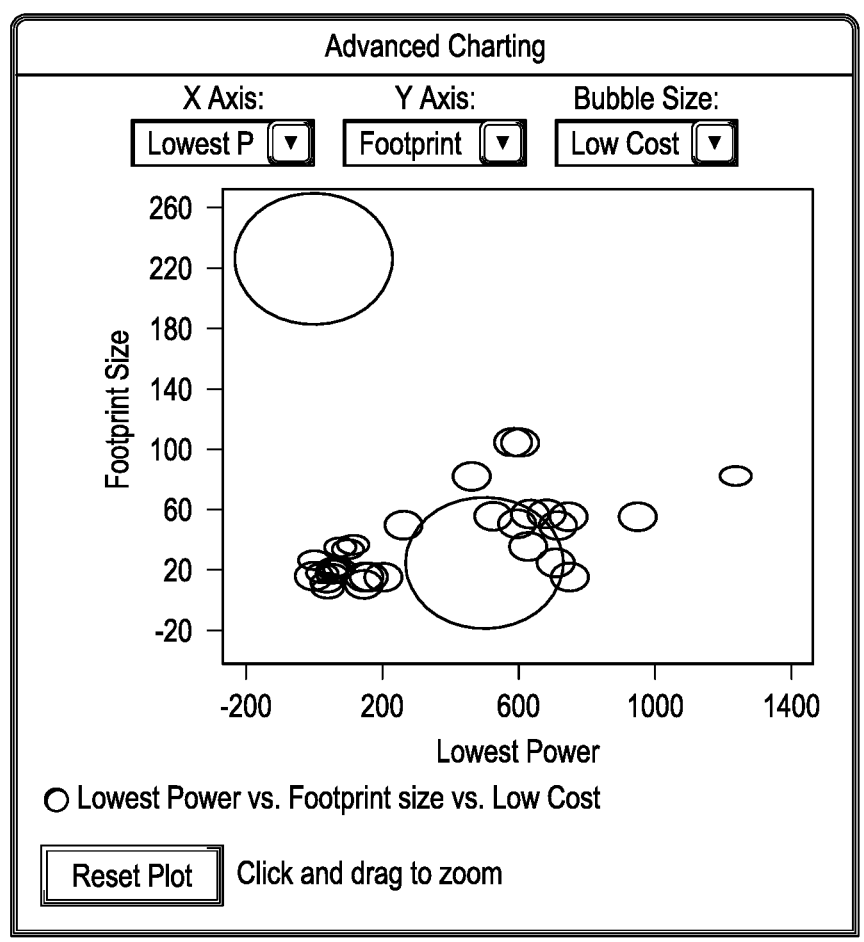

After a design template is selected or uploaded, the tool may provide options for selecting various parameters for the device such as for example, data rate, voltage supple, protocol, rating, and the like as illustrated in FIG. 6B. These parameters can be selected for each individual device. The tool may use the parameters and criteria inputted as a guide and then convert them into scoring metrics and part selection equations to select optimal interface parts from a database and display various choices. The database may be stored internally in the tool or may be accessed externally via various wired or wireless communication channels. The tool may further provide option for filtering out interface solutions using advanced filter and sliders as illustrated in FIG. 6C.

Figure 6D:
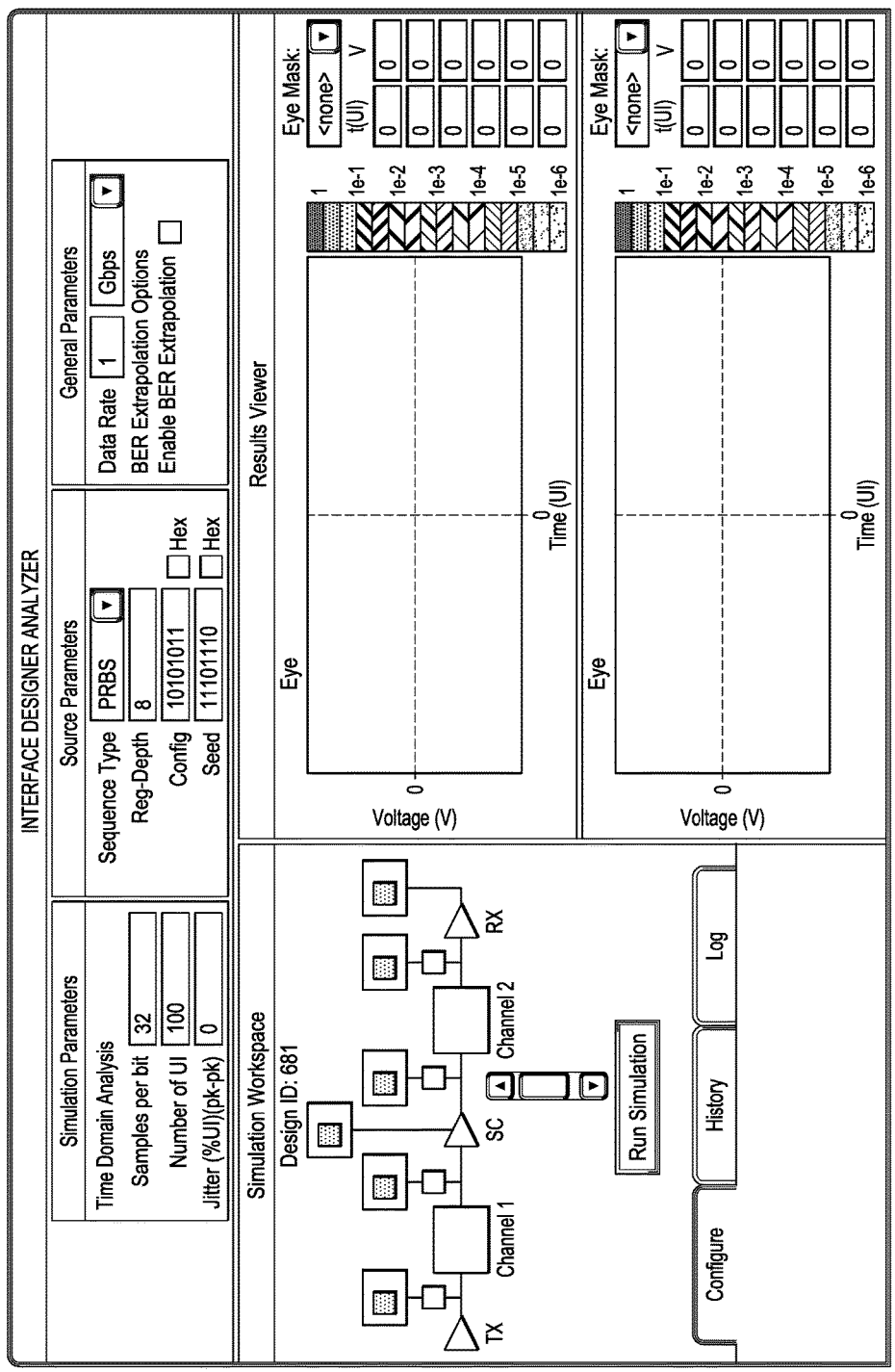
Figure 6E:
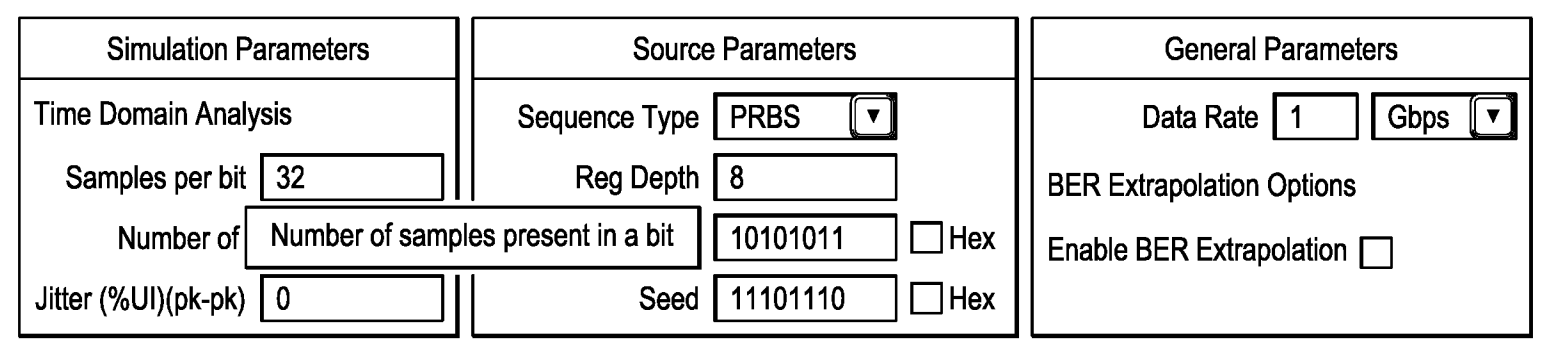
Figure 6F:
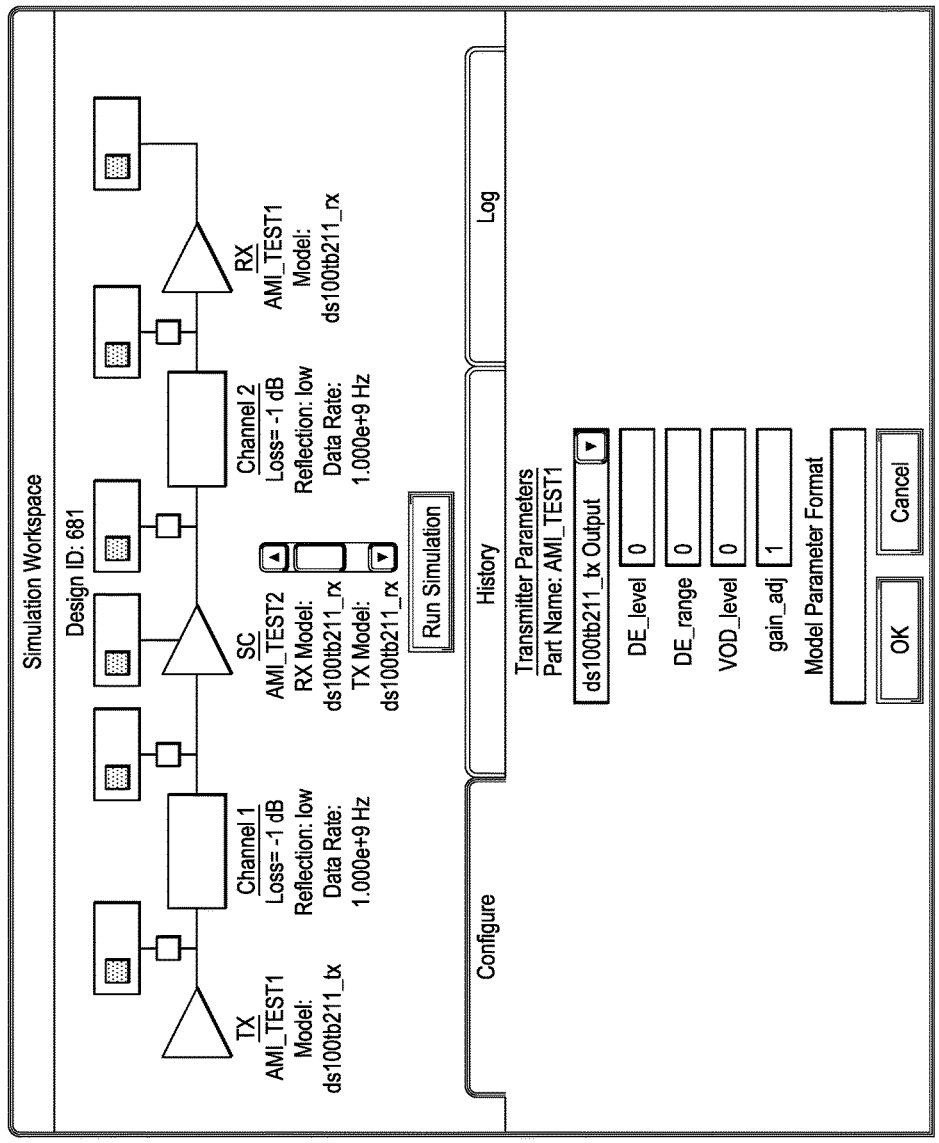

After selecting devices that meet inputted criteria and parameters, the tool may provide various visual comparative information based on the parameters and criteria in the form of charts, graphs, textual data, tables, and the like. One such exemplary display is illustrated in FIG. 6D. After selecting a desired device based on the suggestive comparative analysis, the selected part can then be simulated using various simulation parameters. These parameters can be inputted using exemplary displays such as the one illustrated in FIG. 6E. Once a device is selected, the tool may instantiate the selected device into a predetermined template/schematic. One such exemplary template is illustrated in FIG. 6F. At this stage, specific device settings and system data-path characteristic can be configured to identify best matching predefined data-path characteristic from transmission library of the database.

Figure 6G:
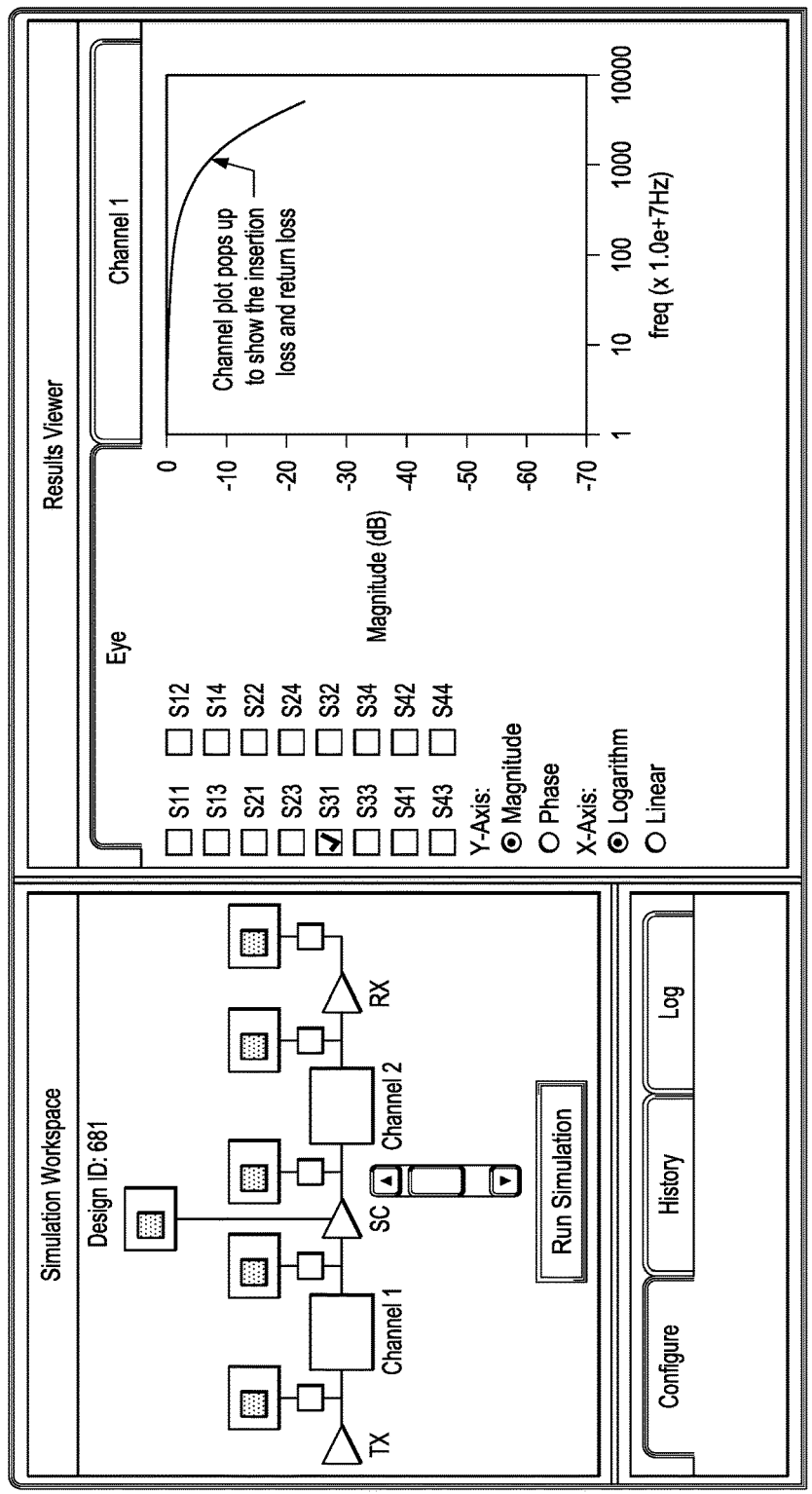
Figure 6H:
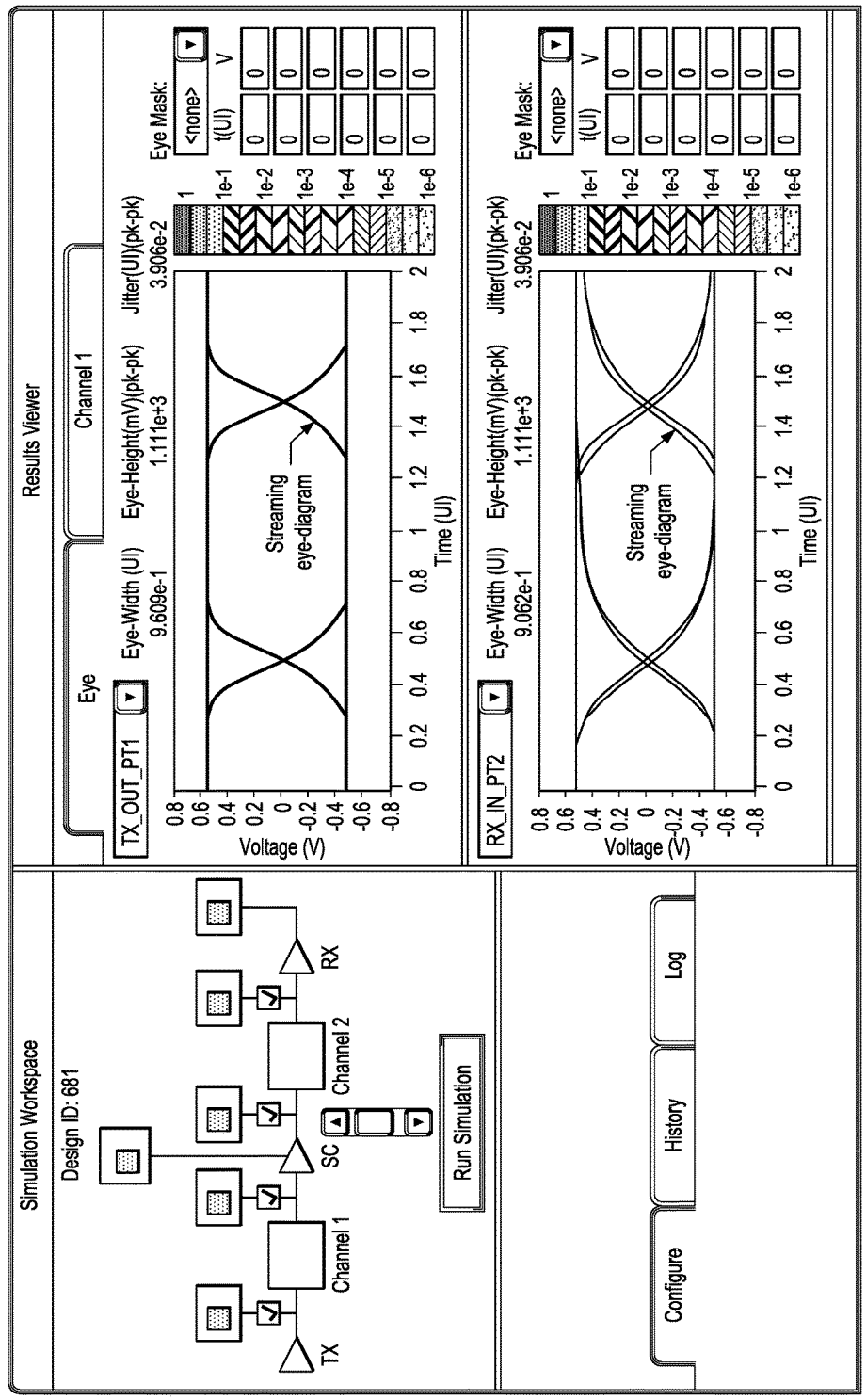
Figure 6I:
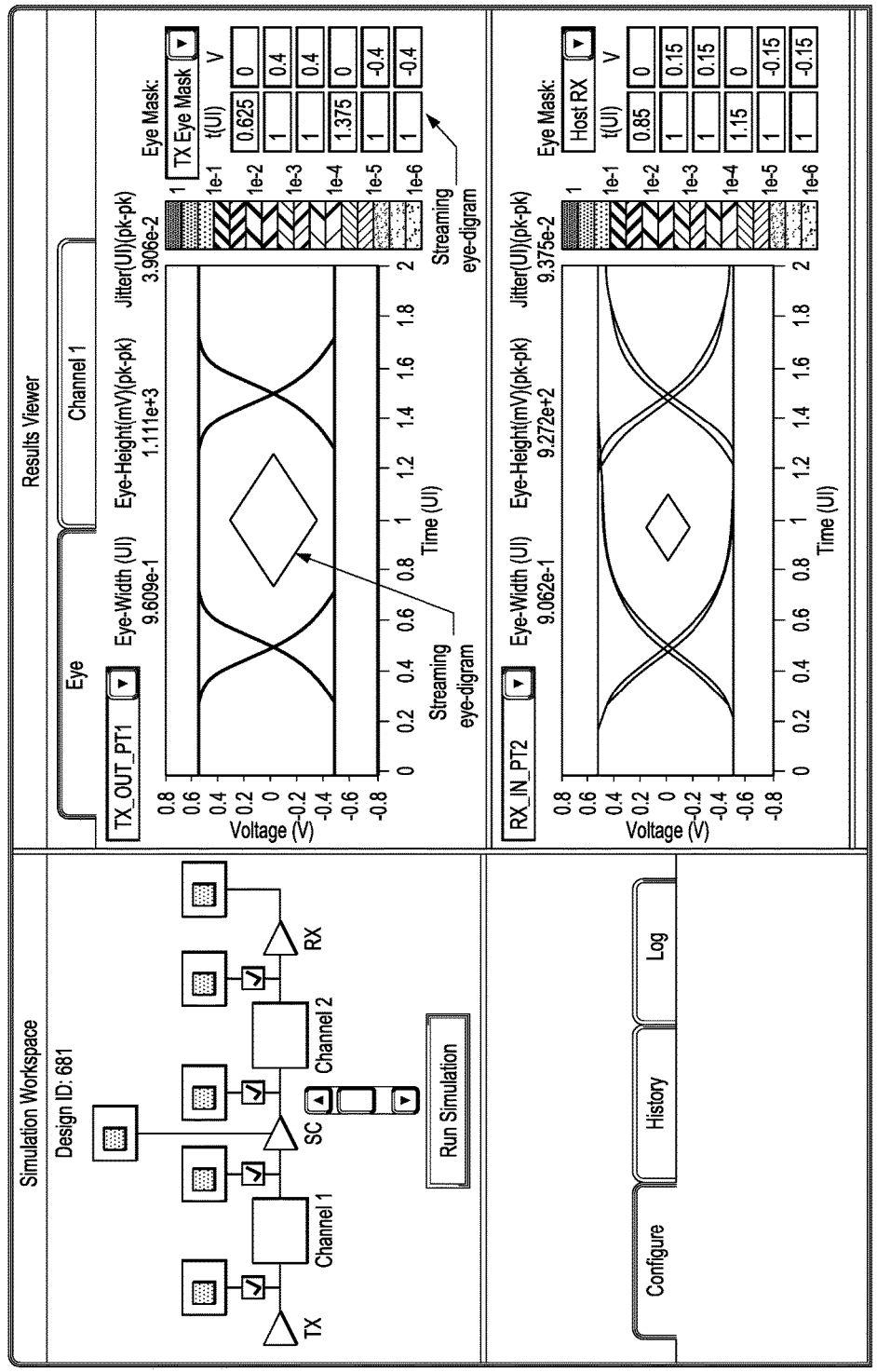

Once all parameters and characteristics are inputted, the tool may run a simulation based on the give criteria and provide exemplary data-path/channel characteristics such as the one illustrated in FIG. 6G. As stated hereinabove, eye-diagrams can be used to analyze signal integrity of a given circuit. The design methodology tool can provide eye-diagram of the circuit under simulation based on the characteristics provided to display simulated signal integrity. One such exemplary eye-diagram is illustrated in FIG. 6H. The exemplary eye-diagram can be updated using live streaming algorithm. The tool may further provide flexibility to a designer to specify eye-mask and overlay it into eye-diagram for standard compliance test as illustrated in FIG. 6I.

Referring to FIGS. 7A-E, an exemplary system architecture 700 for a design methodology and link optimization tool and its functions are illustrated according to an embodiment. System 700 includes a user interface 710. The user interface may be any computing device based user interface such as a computer aided designing system, a general purpose computer, a mobile device, or any other device that can interface and communicate with internet servers 710 and design methodology tool 720 via wireline (712, 714) or wireless interface through transceivers (not shown). The user interface 710 may have various applications executing that can provide web based access through web server 720 or direct access to the design methodology tool 720. The user interface device 710 may be configured to generate circuit designs and mathematical models of the circuit design such as s-parameter model as explained hereinabove.

The internet server 720 may be any worldwide web based server that can connect the user interface device 710 and the design methodology tool unit 730 either via wireline connections (722), wireless connections, or a combination thereof. The design methodology too unit may be any computing device configured to provide design interface selections and signal integrity and link optimization according to various embodiments described herein. The design methodology tool unit 730 may be a standalone system or distributed over various network components in a network of devices. Further, the design methodology tool unit may be integrated into user interface device as a user application.

The design methodology tool unit 730 includes among many other sub units, processor 732, storage 734, local user interface 736, transceiver 738, and many others. Design methodology tool unit 730 and/or the sub units thereof may be implemented on one or more integrated circuits. While single sub units are shown for explanation purposes; however, the design methodology tool unit 730 is not limited to single sub units as illustrated for example, it can include multiple processors, transceivers, storage devices, special purpose computing units, and various other user interfaces for user interactions. The design methodology tool unit 730 communicates and access database 740. The database 740 is shown as independent unit for explanation; however, the database unit 740 can be an integral unit of the design methodology tool unit 730 or it could be a web or cloud based database configured to provide data as needed to the design methodology tool unit 730. The design methodology tool unit 730 also communicates with various peripheral devices 750 such as monitors, printers, scanners, special purpose design tools, other computers, and various other devices as needed. The peripheral devices 750 can communicate with the design methodology unit 730 via wireline or wireless mediums. The user interface 736 may include various components for communicating with the design methodology tool such as for example a keyboard, a web-based interface, a circuit design tool interface, an electronic file transfer interface, and many other like that.

Figure 7A:
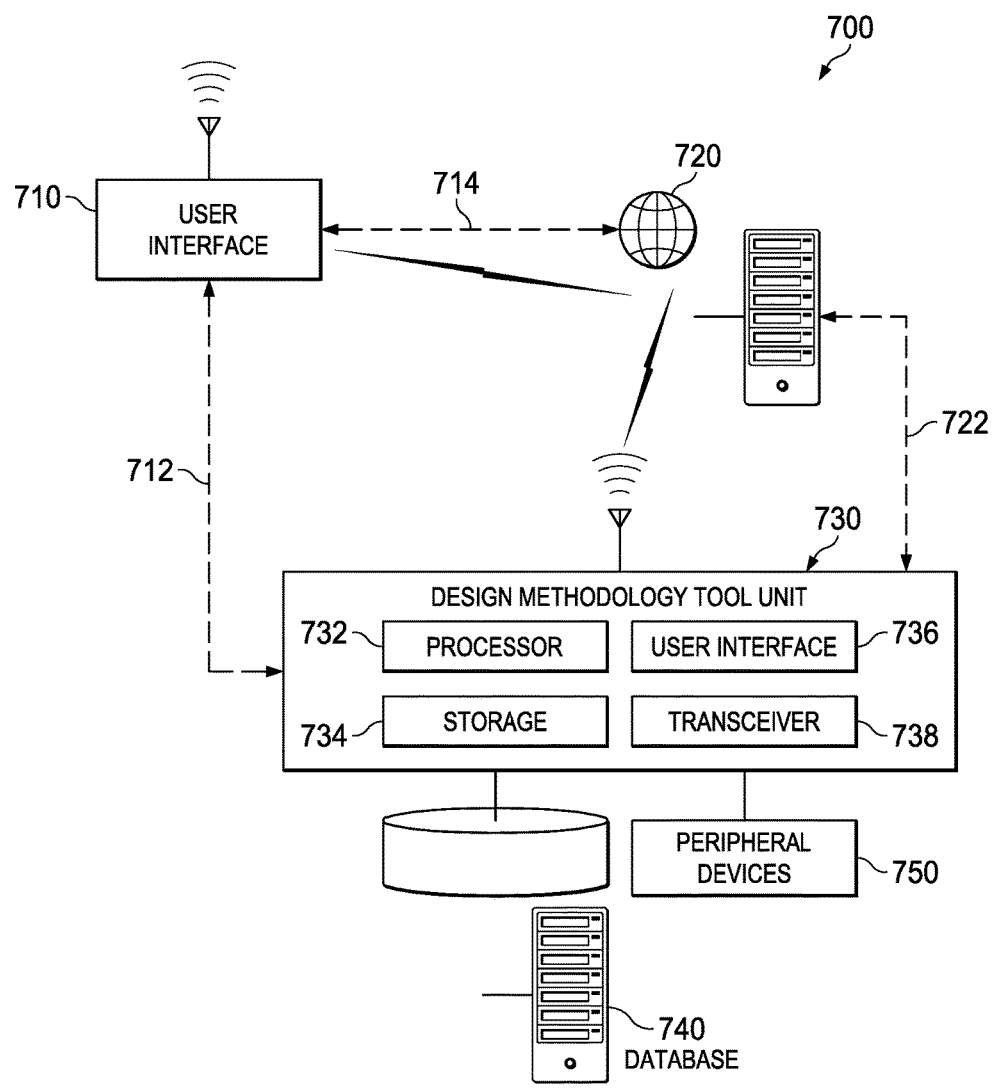
Figures 2, 7D:
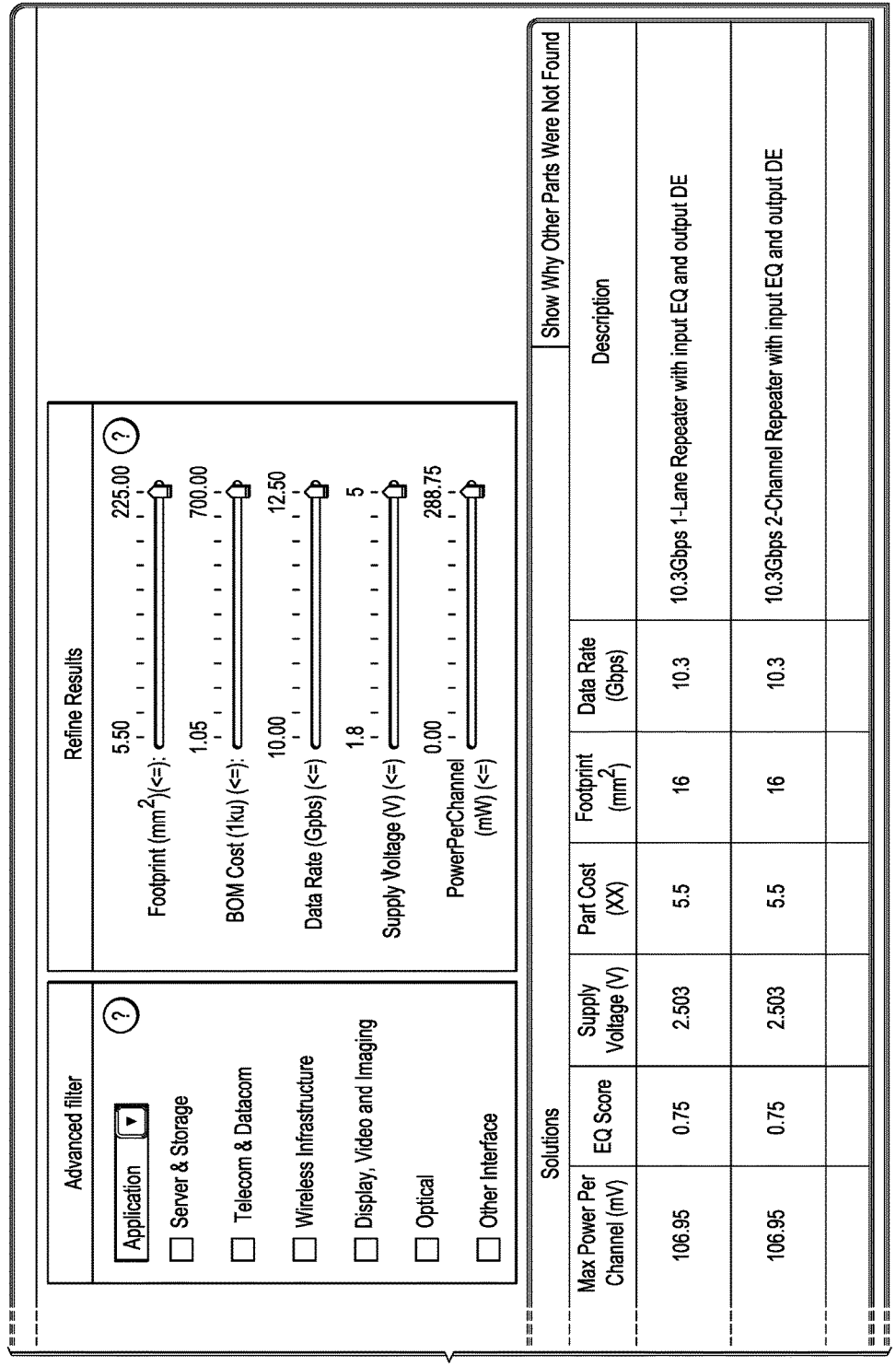
Figures 2, 7E:
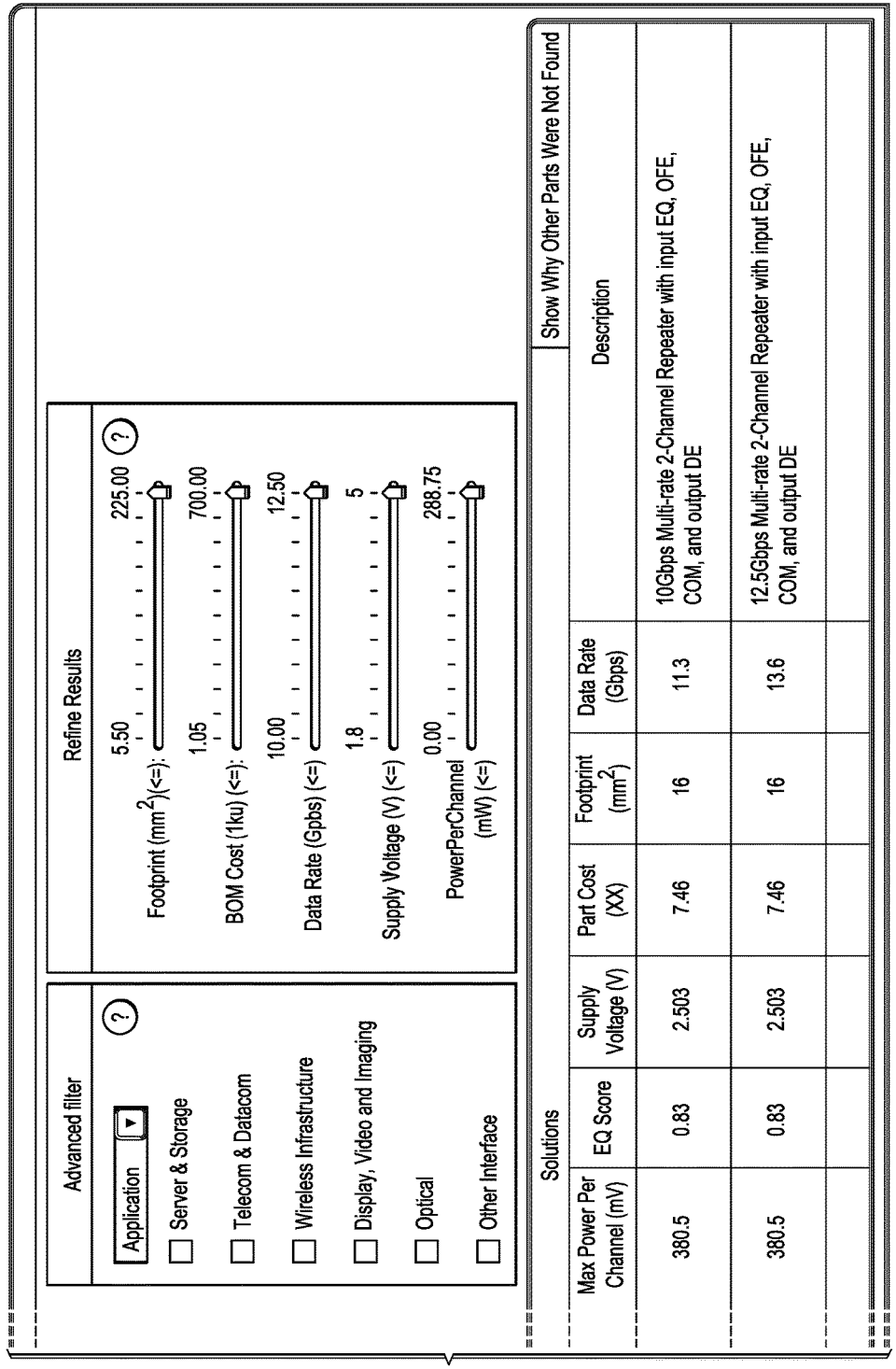

A user can upload a mathematical model of circuit design to the design methodology tool unit 730 either via direct connection or a web based interface from anywhere in the world. The mathematical model can include but not be limited to an s-parameter model. When the user accesses the design methodology tool unit, he/she may interact with a user interface screens as illustrated in FIGS. 7B-C. In this example, a designer selects a transmitter and receiver for his/her design system that runs at 10 Gbps sets the "Max Data Rate" to be 10 Gbps. Once the user makes the selection, in the device selection page the transmitter on the signal flow diagram is highlighted to indicate that it is in active state as illustrated in FIG. 7D. All qualified transmitters that are capable to support 10 Gbps are scored based on their size, cost, and equalization strength and displayed in the order based on the setting of the Optimizer knob shown in FIG. 7D. The default optimizer setting ranks the qualified transmitter based on their total score on size, cost, and equalization strength equally. A designer can change the optimizer knob setting to his/her design emphasis. For example, changing the knob to 5 may sort transmitter based on its equalization strength and followed by the cost and footprint or the like. When a transmitter is selected, device selection section can be marked as selected for example, by highlighting the choice or the like on the screen. Based on the transmitter selected, the tool then identifies qualified receivers that can matchup with the selected transmitter as illustrated in FIG. 7E. After selecting the transmitter-receiver pair, the tool can perform signal integrity analysis for the selected pair.

Referring to FIGS. 8A-E, signal integrity analysis function of the design methodology tool is illustrated according to an embodiment. FIG. 8A illustrates simulation windows for the selected device pair. The top three left windows are simulation configuration windows that can be used to set the simulation parameters. The top right window is the link optimization window used to identify the devices' settings that provide optimal system performance. The middle left window is the Schematic Workspace that is used to initiate the configuration of devices' settings, and update of channel characteristic. The bottom left window consists of a configure tab to configure devices and channel, history tab to keep track of simulation results, Log tab to show the simulation log and Link Optimize tab to show the status of link optimization.

As stated hereinabove, channel characteristics can be defined by using the s-parameter model of the circuit or by defining the channel by its loss or physical length. In an exemplary embodiment, the insertion loss is defined as 36 dB to estimate channel characteristic as illustrated in FIG. 8B. A channel plot rises to the top in the results window to display the channel characteristic. The signal reflection can be reviewed and examined from the channel plot and the signal reflection can be adjusted to be low, medium or high to match desired channel reflection characteristic. When the signal integrity simulation begins, the progress of the simulation can be reported on the screen for example using a progress bar illustrated in FIG. 8C. Also, Eye diagrams for the simulation are also illustrated. In the exemplary illustration, the simulation is partitioned into multiple blocks for run-time optimization and two eye diagrams are shown. Each eye-diagram plot can be incrementally updated at the end of each block, which allows a designer to view the signal integrity of the exemplary system. In the exemplary illustration, the eye-height is 0.255V and the eye-width is 0.7734UI at the slicer of the receiver.

Figure 8D:
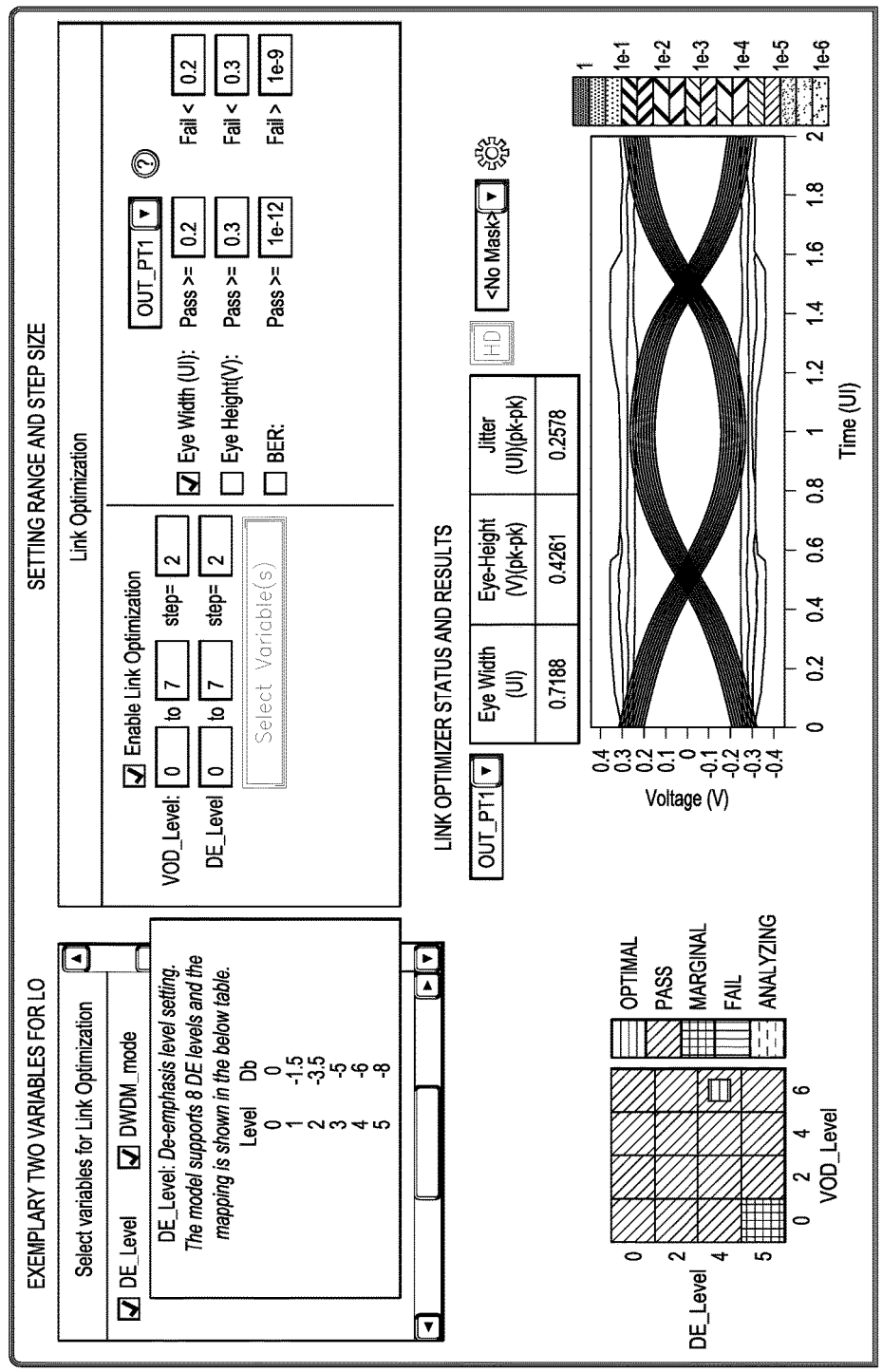

The designer can optimize the link for the selected device using the methodology tool. The tool allows the designer to check the Enable Link Optimization box and a click on the Select Variable(s) button in the Link Optimization Window as illustrated in FIG. 8D. A designer can set multiple parameters from the selected devices to optimize system performance. In the exemplary illustration, the receiver has auto-adaptation algorithms for CTLE and DFE, therefore its settings can be optimized by the AMI model. This requires the designer to optimize the transmitter amplitude and de-emphasis settings (e.g., two parameters of the device) as illustrated in FIG. 8D. As stated herein above, by setting the range and step size for the transmitter amplitude and transmitted de-emphasis, number of iterations can be set.

Figure 8E:
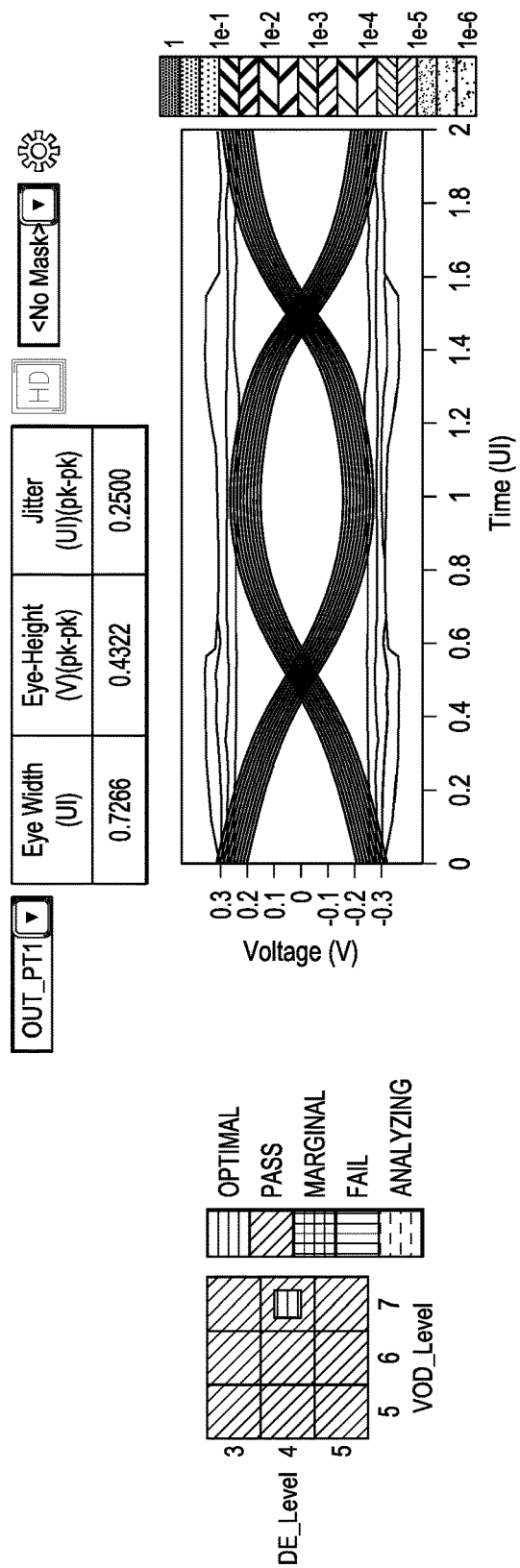

The optimization function of the tool iterates through all the specified settings and gauges the performance of each setting based on the selected metric or matrices. The link optimization algorithm examines the performance at the end of each blocks, it advances the simulation to the next setting to cover the whole user specified search space. After completing the last iteration, the optimal setting is identified on the link optimizer's status bar as illustrated in FIG. 8E. The optimal settings are back annotated into the schematic. From the coarse optimization results, the designer we can refine the DE_LEVEL range to 3 to 5 and VOD_Level to 5 to 7. The fine optimization then identifies the optimal point as VOD_LEVEL as 7 and DE_LEVEL as 4 with eye-height of 0.432V and 0.726UI.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An apparatus comprising:
a user interface; and
a processing unit coupled to the user interface and configured to:
receive a representative model of an electronic circuit from the user interface,
receive at least one parameter from the user interface;
search a database for one or more electronic devices that match the at least one parameter;
select an electronic device based on a functional element of the electronic circuit, wherein the functional element of the electronic circuit comprises one or more of a transmitter and a receiver;
perform signal integrity analysis for the electronic circuit using one or more characteristics of the selected electronic device; and
identify settings for the electronic device by performing an auto-adaptation algorithm when the electronic device is a receiver or adjusting the range for a transmitter amplitude and a transmitter de-emphasis when the electronic device is a transmitter.

2. The apparatus of claim 1, wherein the representative model of the electronic circuit is an s-parameter model of the electronic circuit.

3. The apparatus of claim 1, wherein the user interface is one or more of:
a web-based interface;
a wireless interface; and
a user input device including one or more of a keyboard, a circuit design tool, and an electronic file transfer unit.

4. The apparatus of claim 1, further comprising:
a database unit coupled to the processing unit, wherein the database unit is coupled to the processing via one or more of:
an internal storage of the apparatus,
a web-based interface, and
a network interface.

5. The apparatus of claim 4, wherein the parameter of the electronic circuit comprises one or more of:
a data rate of the circuit,
a supply voltage, and
a protocol used by the electronic circuit.

6. The apparatus of claim 1, wherein the processing unit is configured select the electronic device from a plurality of electronic devices based at least in part on a ranking of the plurality of electronic devices.

7. The apparatus of claim 6, wherein the ranking of the plurality of electronic devices is based at least in part on a plurality of parameters received from the user interface.

8. A method comprising:
receiving, by a processing unit, a representative model an electronic circuit from a user interface;
receiving, by the processing unit, at least one parameter from the user interface;
searching, by the processing unit, a database for one or more electronic devices that match the at least one parameter;
select, by the processing unit, an electronic device based on a functional element of the electronic circuit, wherein the functional element of the electronic circuit comprises one or more of a transmitter and a receiver;
performing, by the processing unit, signal integrity analysis for the electronic circuit using one or more characteristics of the selected electronic device; and
identifying, by the processing unit, settings for the electronic device by performing an auto-adaptation algorithm when the electronic device is a receiver and adjusting the range for a transmitter amplitude and a transmitter de-emphasis when the electronic device is a transmitter.

9. The method of claim 8, further comprising:
displaying signal integrity analysis.

10. The method of claim 9, wherein displaying the signal integrity analysis includes at least an eye-diagram of the signal.

11. The method of claim 10, further comprising:
updating signal integrity analysis based at least in part on the eye-diagram.

12. The method of claim 8, wherein the representative model of the electronic circuit is an s-parameter model of the electronic circuit.

13. The method of claim 8, wherein the user interface is one or more of:
a web-based interface;
a wireless interface; and
a user input device including one or more of a keyboard, a circuit design tool, and an electronic file transfer unit.

14. The method of claim 8, wherein the parameter of the electronic circuit comprises one or more of;
a data rate of the circuit,
a supply voltage, and
a protocol used by the electronic circuit.

15. The method of claim 8, further comprising:
selecting the electronic device from a plurality of electronic devices based at least in part on a ranking of the plurality of electronic devices.

16. The method of claim 15, wherein the ranking of the plurality of electronic devices is based at least in part on a plurality of parameters received from the user interface.

* * * * *